(12) United States Patent
Hamamoto et al.

(10) Patent No.: US 8,431,953 B2
(45) Date of Patent: Apr. 30, 2013

(54) SILICONE RESIN COMPOSITION AND AN OPTICAL SEMICONDUCTOR DEVICE MAKING USE OF THE COMPOSITION

(75) Inventors: Yoshihira Hamamoto, Annaka (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/349,817

(22) Filed: Jan. 13, 2012

(65) Prior Publication Data

US 2012/0184663 A1   Jul. 19, 2012

(30) Foreign Application Priority Data

Jan. 17, 2011 (JP) ................................. 2011-007347

(51) Int. Cl.
*H01L 33/52* (2010.01)
*C09D 183/07* (2006.01)

(52) U.S. Cl.
USPC .................... 257/100; 257/E33.059; 525/478

(58) Field of Classification Search .................. 257/100, 257/E33.059
See application file for complete search history.

(56) References Cited

U.S. PATENT DOCUMENTS

| | | | | |
|---|---|---|---|---|
| 6,815,520 B2* | 11/2004 | Yoneda et al. | ................... | 528/31 |
| 7,323,250 B2* | 1/2008 | Tabei et al. | ................... | 428/447 |
| 7,838,117 B2* | 11/2010 | Miyoshi et al. | ............... | 428/447 |
| 2006/0057297 A1* | 3/2006 | Chevalier et al. | ............. | 427/387 |
| 2007/0032595 A1* | 2/2007 | Yamakawa et al. | ........... | 524/862 |
| 2007/0249790 A1* | 10/2007 | Kashiwagi et al. | ........... | 525/478 |
| 2008/0015326 A1* | 1/2008 | Kodama et al. | ................. | 528/15 |
| 2008/0207848 A1 | 8/2008 | Morita et al. | | |
| 2008/0249259 A1* | 10/2008 | Kashiwagi | .................... | 525/478 |
| 2010/0068538 A1* | 3/2010 | Fisher | .......................... | 428/447 |
| 2010/0197870 A1* | 8/2010 | Kashiwagi et al. | ........... | 525/475 |
| 2012/0056236 A1* | 3/2012 | Hamamoto et al. | .......... | 257/100 |

FOREIGN PATENT DOCUMENTS

JP   2000 017176   1/2000

OTHER PUBLICATIONS

European Search Report for EP 12151218 dated Jun. 14, 2012.
Konica Corp., "Silicone composition for optical use and lens," Patent Abstracts of Japan, Publication Date: Jan. 18, 2000; English Abstract of JP-2000 017176.

* cited by examiner

*Primary Examiner* — Robert S Loewe
(74) *Attorney, Agent, or Firm* — Millen, White, Zelano & Branigan, P.C.

(57) ABSTRACT

[Object]
To provide a silicone resin composition for optical semiconductor devices, which has a low gas permeability and high dependability.
[Means for solution]
The silicone resin composition of the present invention contains the following components (A) through (D):
(A) an organopolysiloxane as shown in the following general formula (1) in which the number of alkenyl groups contained per one molecule is two or more $$(R^1SiO_{3/2})_x(R^2{}_3SiO_{1/2})_y(R^2{}_2SiO_{2/2})_z \qquad (1)$$

(wherein $R^1$ is a cycloalkyl group, $R^2$ is either one kind of or more than one kind of substituted or non-substituted monovalent hydrocarbon group having 1-10 carbon atoms, x is 0.5-0.9, y is 0.1-0.5, z is 0-0.2, and x+y+z=1.0),
(B) a hydrogen organopolysiloxane containing at least two SiH groups per one molecule,
(C) a catalyst for addition reaction,
(D) an adhesion promoter agent.

7 Claims, No Drawings

SILICONE RESIN COMPOSITION AND AN OPTICAL SEMICONDUCTOR DEVICE MAKING USE OF THE COMPOSITION

PRIORITY CLAIMED

The present non-provisional application claims priority, as per Paris Convention, from Japanese Patent Application No. 2011-007347 filed on Jan. 17, 2011, the disclosure of which is hereby incorporated by reference herein in its entirety.

FIELD OF THE INVENTION

This invention relates to a silicone resin composition useful as an encapsulant for an optical semiconductor device and to an optical semiconductor device making use of such composition.

TECHNICAL BACKGROUND OF THE INVENTION

In recent years, high brilliance LED having stronger light intensity and heat dissipation have been commercialized, and they have been widely used in general lighting applications. This is accompanied however by a problem of discoloration of the encapsulant caused by a corrosive gas. In order to solve this problem, Japanese Patent Application Publication No. 2005-272697 (IP Publication 1), for example, reports that an encapsulant excellent in heat resistance, light resistance and weather resistance is obtained through addition of hindered amine light stabilizer to a phenyl silicone resin. Also, Japanese Patent Application Publication No. 2009-215434 (IP Publication 2) proposes a silicone resin composition capable of preventing organic resin package from degrading and extending the life of LED, and this silicone resin composition contains a silicone resin (e.g., methyl silicone resin) which has two or more aliphatic unsaturated bonds in one molecule and does not have any aromatic hydrocarbon group but has an aliphatic hydrocarbon group as a substituent group.

However, these above-mentioned silicone resin compositions, while excellent in light resistance, heat discoloration resistance and shock resistance, exhibit large coefficients of linear thermal expansion and high gas permeability, so that it is known that a corrosive gas would attack and blacken the silver surface plated on the substrate used in an optical semiconductor device such as LED, and, as a result, would weaken the brightness of the LED; hence a further improvement is desired.

Also, Japanese Patent Application Publication No. 2000-17176 (IP Publication 3) reports on an optical purpose silicone composition containing an organopolysiloxane with a cycloalkyl group; however, this cannot dispense with $SiO_2$ units, wherefore a problem in its crack resistance.

PRIOR PUBLICATIONS

IP Publications

[IP Publication 1] Japanese Patent Application Publication No. 2005-272697
[IP Publication 2] Japanese Patent Application Publication No. 2009-215434
[IP Publication 3] Japanese Patent Application Publication No. 2000-17176

SUMMARY OF THE INVENTION

The Problems the Invention Seeks to Solve

It is an object of the present invention to provide a silicone resin composition for optical semiconductor encapsulation which exhibits low gas permeability, and it is another to provide a highly reliable photo semiconductor device.

Means to Solve the Problems

The present inventors conducted various examinations to achieve these goals, and as the result, they found that a silicone resin composition containing, as the exclusive source of vinyl group, a vinyl silicone resin made up of trifunctional T unit containing a cycloalkyl group such as cyclohexyl group, exhibits low gas permeability and the resulting cured body is hard to discolor. Furthermore, it was found that, by encapsulating an optical semiconductor device (high brightness LED and the like) with a cured body of such silicone resin composition, it was possible to embody an optical semiconductor device excellent in discoloration resistance and reflection efficiency. Based on these findings, the present inventors made vigorous efforts and came to a completion of the present invention.

In particular, the present invention relates to a silicone resin composition characterized in containing the following components (A)-(D).
(A) an organopolysiloxane as shown in the following molecular formula (1), wherein at least two alkenyl groups are contained in one molecule

[formula 1]

$$(R^1SiO_{3/2})_x(R^2{}_3SiO_{1/2})_y(R^2{}_2SiO_{2/2})_z \quad (1)$$

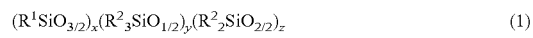

(wherein $R^1$ is a cycloalkyl group, $R^2$ is either one kind of or more than one kind of monovalent hydrocarbon group having 1-10 carbon atoms with or without substituent(s), x is 0.5-0.9, y is 0.1-0.5, z is 0-0.2, and x+y+z=1.0)
(B) a hydrogenorganopolysiloxane containing at least two SiH group in one molecule
(C) a catalyst for addition reaction
(D) an adhesion promoter.

Effects of the Invention

According to the present invention, the organopolysiloxane, which is the component (A), has a skeleton chiefly consisting of T units (trifunctional unit) containing a cycloalkyl group such as cyclohexyl group, so that it can provide a silicone resin composition having low gas permeability and high anti-sulfuration characteristic (anti gas corrosion characteristic). Furthermore, the cured form of this silicone resin composition has such low gas permeability that the optical semiconductor device encapsulated by this cured resin excels in discoloration resistance and durability in reflective index; therefore the silicone resin composition of the present invention has properties that are very useful as the encapsulant for LED which is required to have high heat resistance and high light resistance.

EMBODIMENTS TO PRACTICE THE INVENTION

The invention will be described in detail below.
The silicone resin composition of the present invention is characterized by containing the afore-mentioned components (A) through (D).

The component (A) is represented by the following formula (1), and contains at least two alkenyl groups in one molecule.

[formula 2]

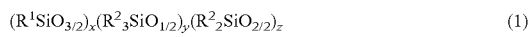

(wherein $R^1$ is a cycloalkyl group, $R^2$ is either one kind of or more than one kind of substituted or non-substituted monovalent hydrocarbon group having 1-10 carbon atoms, x is 0.5-0.9, y is 0.1-0.5, z is 0-0.2, and x+y+z=1.0)

In the molecular formula (1), $R^1$ is a cycloalkyl group, and preferably it is a cycloalkyl group having 3-8 carbon atoms, or even more preferably 3-6 carbon atoms. Examples of such $R^1$ include a cyclopropyl group, a cyclobutyl group, a cyclopentyl group, a cyclohexyl group, a cyclooctyl group, and any of these wherein some or all of the hydrogen atoms is/are substituted by halogen atom(s) such as fluorine, bromine and chlorine, or by cyano group, hydroxy group, or amino group, that is, halogen-substituted alkyl groups, e.g., chlorocyclopropyl group, bromocyclopropyl group and trifluoropropyl group, and cyanocyclopropyl group. Among these, cyclohexyl group and cyclopentyl group are more preferred and cyclohexyl is the champion choice.

In the molecular formula (1), $R^2$ is either one kind of or more than one kind of substituted or non-substituted monovalent hydrocarbon group having 1-10 carbon atoms or preferably 1-6 carbon atoms. Examples of such $R^2$ includes: alkyl groups such as methyl group, ethyl group, propyl group, isopropyl group, butyl group, isobutyl group, tert-butyl group, pentyl group, neopentyl group, hexyl group, octyl group, nonyl group and decyl group; aryl groups such as phenyl group, tolyl group, xylyl group and naphthyl group; aralkyl group such as benzyl group, phenylethyl group and phenylpropyl group; and any of these wherein some or all of the hydrogen atoms is/are substituted by a halogen atom such as fluorine, bromine and chlorine, or by cyano group, hydroxy group, or amino group, that is, halogen-substituted alkyl groups, e.g., chloromethyl group, chloropropyl group, bromoethyl and trifluoropropyl group; and alkenyl groups such as cyanoethyl group, vinyl group, allyl group, propenyl group, isopropenyl group, butenyl group, hexenyl group, cyclohexenyl group and octenyl group.

At least two of $R^2$'s of the component (A) need to be alkenyl group. It is preferable that 50 mol % or more, or more preferably 80 mol % or more, of the component (A) is such that at least one of the $R^2$'s of the $(R^2{}_3SiO_{1/2})$ part of the molecule is/are alkenyl group. The alkenyl group is preferably vinyl group or allyl group and vinyl group is the optimum choice.

The organopolysiloxane as the component (A) is one having a three-dimensional network structure essentially consisting of a chain of units of $(R^1SiO_{3/2})$ which is terminated at both ends with triorganosiloxane group $(R^2{}_3SiO_{1/2})$ unit, and in order to impart flexibility it is well to introduce a small amount of $(R^2{}_2SiO_{2/2})$ units. In so doing, it is preferable that at least one of $R^2$'s is cycloalkyl group. The z representing the ratio of the unit $(R^2{}_2SiO_{2/2})$ should be in a range of 0-0.2, and when it is greater than 0.2 the gas permeability, the antihardening characteristic, etc. are lowered.

It is preferable that the content of the cycloalkyl group $(R^1)$ is such that it accounts for 25-80 mol %, or even more preferably for 30-70 mol %, of the total of $R^1$ and $R^2$ of the component (A). When the content of the cycloalkyl group is too small, the gas permeability is overly increased with a result that the silver face in the LED package is corroded and the brightness of the LED can be weakened. Examples of the organopolysiloxane represented by the formula (1) include the followings.

[formula 3]

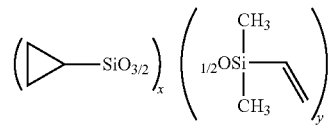

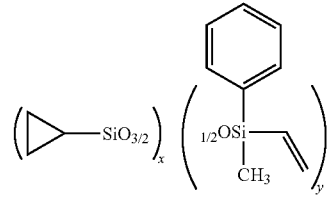

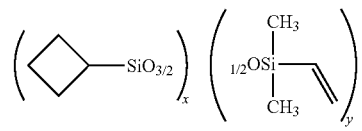

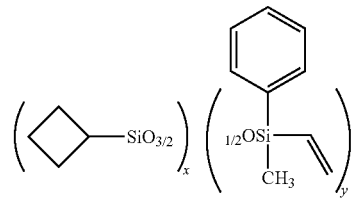

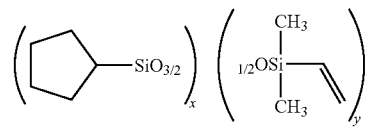

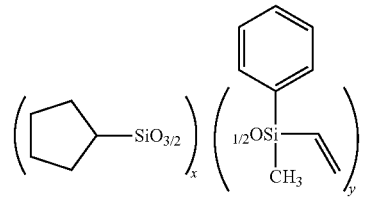

[formula 4]

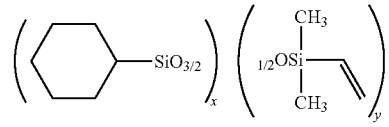

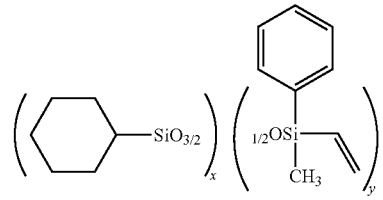

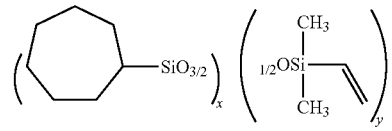

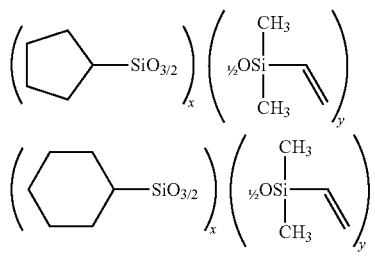

(In the above formula, x, y, and z are as defined above.)
Among these the followings are preferred:

The most preferable is the following:

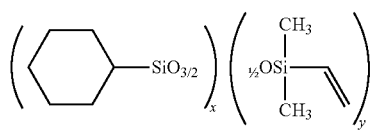

It is preferable that the organopolysiloxane of the above resin structure is composed in a manner such that, a molar ratio of (unit b)/(unit a) is 0.2-1, preferably 0.25-0.7, wherein the unit a represents $SiO_{3/2}$ and the unit b represents $R^2{}_2SiO_{1/2}$. Also, the organopolysiloxane preferably has a molecular weight which falls in the range of 500-10,000, in terms of an average molecular weight as calculated by conversion based on the polystyrene count as per GPC (gel penetration chromatography).

Incidentally, the organopolysiloxane of the above resin structure can contain, in addition to the unit a and the unit b, a trifunctional siloxane unit (that is, organosilsesquioxane unit) in a small amount which does not affect the purpose of the present invention.

The organopolysiloxane of the above resin structure can be easily synthesized by combining chemicals which yield the units a and b, respectively, in a molar ratio within the above described ranges, and conducting, for example, a co-hydrolysis reaction in the presence of an acid.

As the chemical that yields unit a, it is possible to use a trifunctional silane such as cyclohexyltrichlorosilane, cyclohexyltrimethoxysilane, cyclohexyltriethoxy silane, cyclopentyltrichlorosilane, cyclopentyltrimethoxysilane and cyclopentyltriethoxysilane.

As the chemical that yields unit b, it is possible to use any one of the following terminal stoppers.

[formula 5]

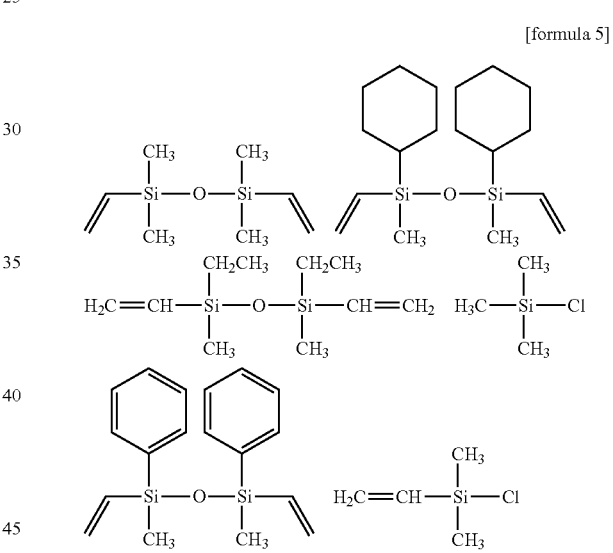

As the source for $R^2{}_2SiO_{2/2}$ units, it is possible to use a bifunctional silane such as cyclohexylmethyldichlorosilane, cyclohexylmethyldimethoxysilane, cyclohexylmethyldiethoxysilane, cyclopentylmethyldichlorosilane.

The organopolysiloxane of the above resin structure is an important component for rendering the resultant cured body to have sufficient physical strength, sufficiently low gas permeability and improved surface tackiness. In the formula (1), x is 0.5 through 0.9, or preferably 0.6 through 0.8. If x is smaller than 0.5, there would be cases wherein the above-mentioned effects are not sufficiently achieved, and if x exceeds 0.9, chances are that the viscosity of the resultant silicone resin composition becomes so high that the cured body is liable to crack. It is necessary that y is 0.1 through 0.5, and preferable if it is 0.2 through 0.4.

Next, the explanation relates to hydrogenorganopolysiloxane, the component (B). This hydrogenorganopolysiloxane functions as crosslinking agent, and produces a cured substance as its hydrogen atom bonded to silicon atom (hereinafter, SiH group) undergoes an addition reaction with an alkenyl group in the component (A). This hydrogenorganopolysiloxane may be any one, straight-chained or ramified, so long as it contains at least two SiH groups per molecule; in particular the one represented by the following average composition formula (2) is preferable to use:

[formula 6]

$$R^3{}_a H_b SiO_{(4-a-b)/2} \quad (2)$$

(wherein $R^3$ is a monovalent, substituted or non-substituted hydrocarbon group, except for alkenyl group, having 1-10 carbon atoms, and a is 0.4 through 1.5, b is 0.05 through 1.0, and a+b is 0.5 through 2.0.).

In the above shown average composition formula (2), $R^3$ is a monovalent, substituted or non-substituted hydrocarbon group, except for alkenyl group, having 1-10 carbon atoms, and it, preferably, is a monovalent hydrocarbon group having 1-7 carbon atoms, of which examples include a low alkyl group such as methyl group, a cycloalkyl group such as cyclopentyl group and cyclohexyl group, an aryl group such as phenyl group, and any one of these in which some or all of hydrogen atoms is/are substituted by a halogen atom such as fluorine, bromine and chlorine, or by cyano group, hydroxy group or amino group, e.g., a halogen-substituted alkyl group such as chloromethyl group, chloropropyl group, bromoethyl group and trifluoropropyl group, and cyano ethyl group.

Also, a and b are specified such that a is 0.4-1.5, b is 0.05-1.0 and a+b is 0.5 through 2.0. The position of the SiH group in the molecule is not specified, and it may be at a terminal of the molecular chain or not, but it is preferable if at least one is in a terminal of the molecular chain.

Examples of such hydrogenorganopolysiloxane as the component (B) include: tris(dimethylhydrogensiloxane)methylsilane, tris(dimethylhydrogensiloxane)phenylsilane, 1,1,3,3-tetramethyldisiloxane, 1, 3, 5,7-tetramethylcyclotetrasiloxane, methylhydrogenpolysiloxane with both terminals stopped with trimethylsiloxy group, dimethylsiloxane-methylhydrogensiloxane copolymer with both terminals stopped with trimethylsiloxy group, dimethylpolysiloxane with both terminals stopped with dimethylhydrogensiloxy group, dimethylsiloxane-methylhydrogensiloxane copolymer with both terminals stopped with dimethylhydrogensiloxy group, methylhydrogensiloxane-diphenylsiloxane copolymer with both terminals stopped with trimethylsiloxy group, methylhydrogensiloxane-diphenylsiloxane-dimethylsiloxane copolymer with both terminals stopped with trimethylsiloxy group, a copolymer consisting of $(CH_3)_2HSiO_{1/2}$ unit and $SiO_{4/2}$ unit, and a copolymer consisting of $(CH_3)_2HSiO_{1/2}$ unit, $SiO_{4/2}$ unit and $(C_6H_5)SiO_{3/2}$ unit.

It is also possible to use, as the component (B), a hydrogenorganopolysiloxane which is obtained by using a unit such as ones whose structures are shown below:

[formula 7]

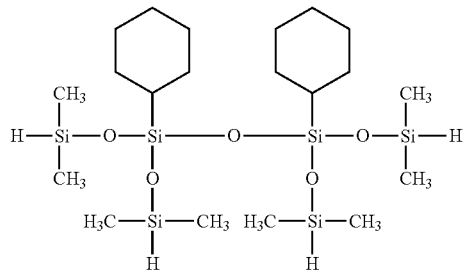

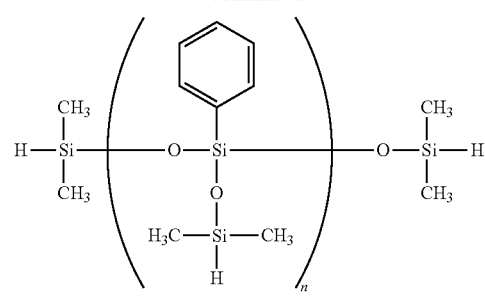

(wherein n is an integral number of 1 to 10)

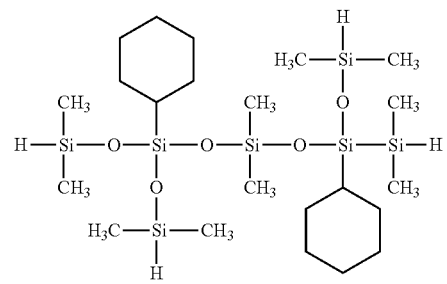

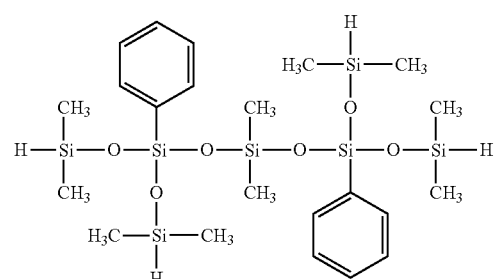

[formula 8]

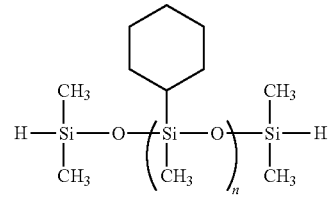

(wherein n is an integral number of 1 to 10)

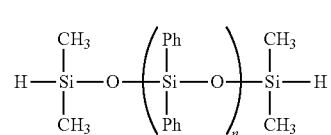

(wherein n is an integral number of 1 to 10)

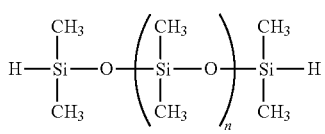

(wherein n is an integral number of 3 to 200)

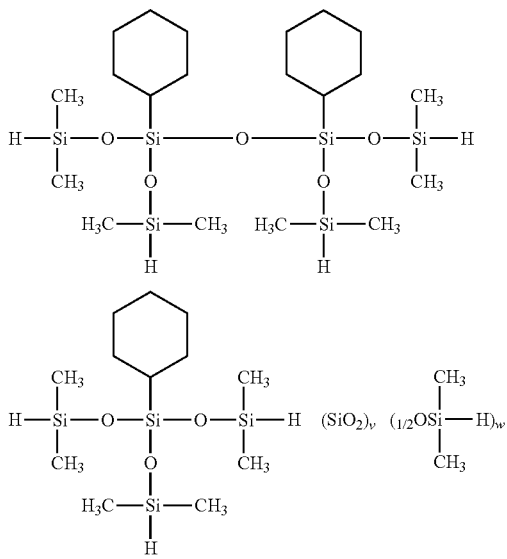

(wherein v and w are integral numbers satisfying v>0, w>0, and v+w=1.0)

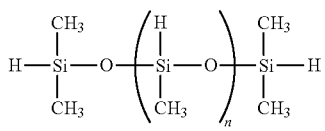

(wherein n is an integral number of 1 to 100)

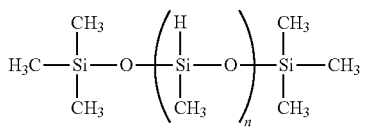

(wherein n is an integral number of 1 to 100)

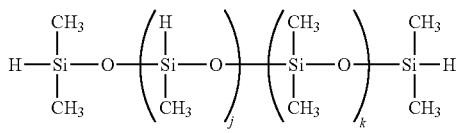

(wherein j is an integral number of 1 to 100 and k is an integral number of 1 to 600)

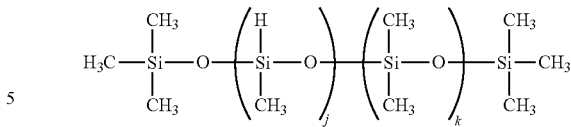

(wherein j is an integral number of 1 to 100 and k is an integral number of 1 to 100).

The molecular structure of the hydrogenorganopolysiloxane as the component (B) may be straight-chained, annular, branched or three-dimensionally networked, and it would be fine if the number of silicon atoms in one molecule (that is, the polymerization degree) is 3-1000, and better if it is 3-100.

Such hydrogenorganopolysiloxane as these may be prepared by any of the known methods, and ordinarily by hydrolyzing a chlorosilane such as $R^6SiHCl_2$, $(R^6)_3SiCl$, $(R^6)_2SiCl_2$, $(R^6)_2SiHCl$, (wherein $R^6$ is the same as above), or by equilibrating in the presence of a super-acid catalyst a siloxane obtained by the hydrolysis.

The dosage of the hydrogenorganopolysiloxane as the component (B) is such as to effect curing of the component (A), and it is preferable if the component (B) is used in an amount such that its SiH group amounts to 0.5-4.0 mol, or more preferably 0.9-2.0 mol, or even more preferably 0.9-1.5 mol relative to one mole of alkenyl group (e.g., vinyl group) in the component (A). If the dosage is smaller than this lower limit, the curing would not proceed and it would be hard to obtain cured body, and if the dosage is greater than the upper limit, a lot of non-reacted SiH group would remain in the cured body so that the rubber characteristic is liable to change with the passage of time.

Next, the catalyst for addition reaction as the component (C) will be explained. The component (C) is dosed for the purpose of promoting the addition reaction, and can be a catalyst containing a platinum group metal such as platinum, palladium, and rhodium; it is good to use a catalyst containing platinum from the viewpoint of cost, etc. Examples of platinum-containing catalyst include $H_2PtCl_6 \cdot mH_2O$, $K_2PtCl_6$, $KHPtCl_6 \cdot mH_2O$, $K_2PtCl_4$, $K_2PtCl_4 \cdot mH_2O$, and $PtO_2 \cdot mH_2O$ (wherein me is a positive integral number). It is also possible to adopt a complex such as one consisting of one of such platinum-containing catalysts and a hydrocarbon, an alcohol or a vinyl group-containing organopolysiloxane. It is also possible to use one of these catalysts singly or two or more of them in combination.

The dosage of the component (C) can be in a so-called catalytic amount; for example, relative to 100 mass parts consisting of the component (A) and the component (B), the catalyst may account for 0.0001-0.2 mass part, or more preferably 0.0001-0.05 mass part, in terms of the net weight of the platinum group metal.

Next, the adhesion promoter as the component (D) will be explained. The silicone resin composition according to the present invention is complete with the component (D), in addition to the above-described components (A)-(C). Examples of this adhesion promoter include: vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, N-2(aminoethyl)-3-aminopropylmethyldiethoxysilane, N-2(aminoethyl)-3-aminopropyltrimethoxysilane, N-2(aminoethyl)-3- aminopropyltriethoxysilane, 3-aminopropyltrimethoxysilane, 3-aminopropyltriethoxysilane, N-phenyl-3-aminopropyltrimethoxysilane, and 3-mercaptopropyltrimethoxysilane; also included are trimethoxysilane and tetramethoxysilane and their oligomers. These adhesion promoters can be used singly or in combination of two or more. The dosage of the adhesion promoter can be 0.001-10 mass parts, or preferably 0.05-5 mass parts, relative to 100 mass parts consisting of the component (A) plus the component (B).

It is also possible to adopt as the component (D) any of the organopolysiloxanes whose structures are shown below.

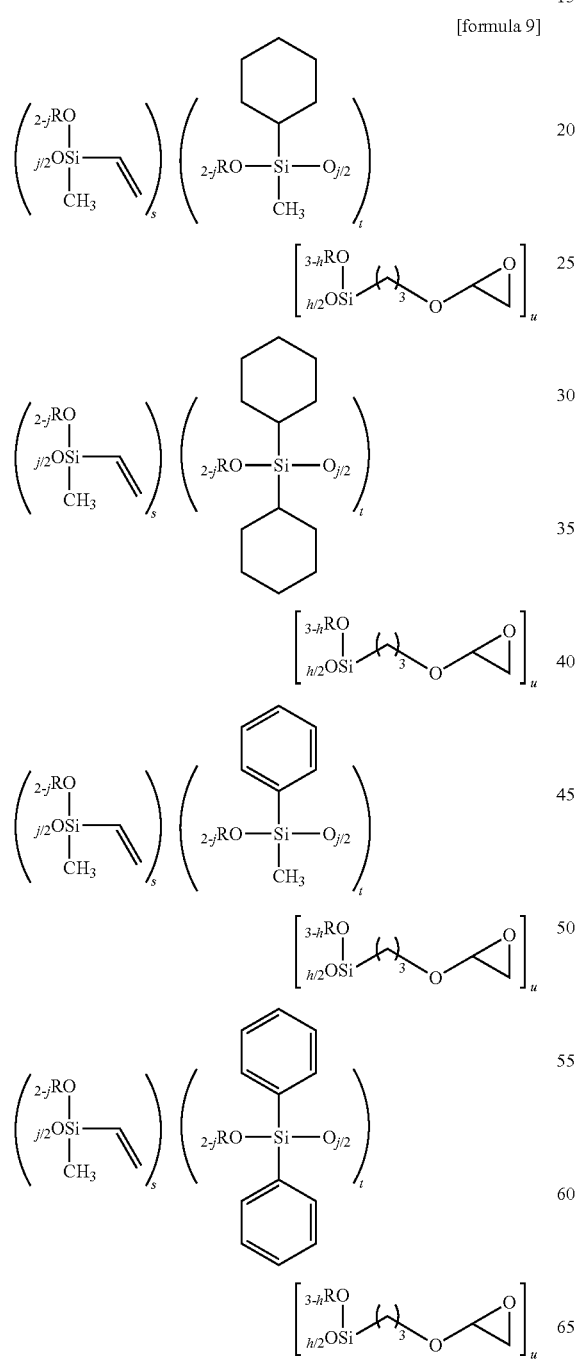

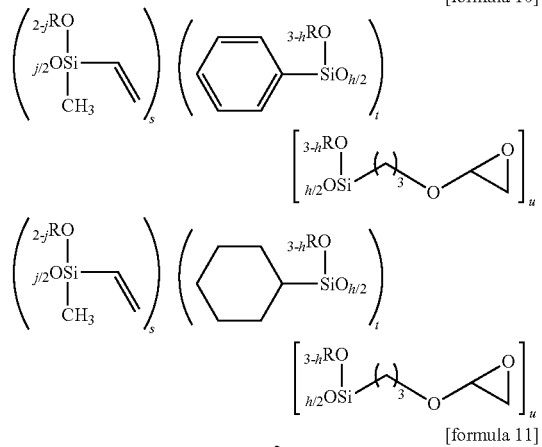

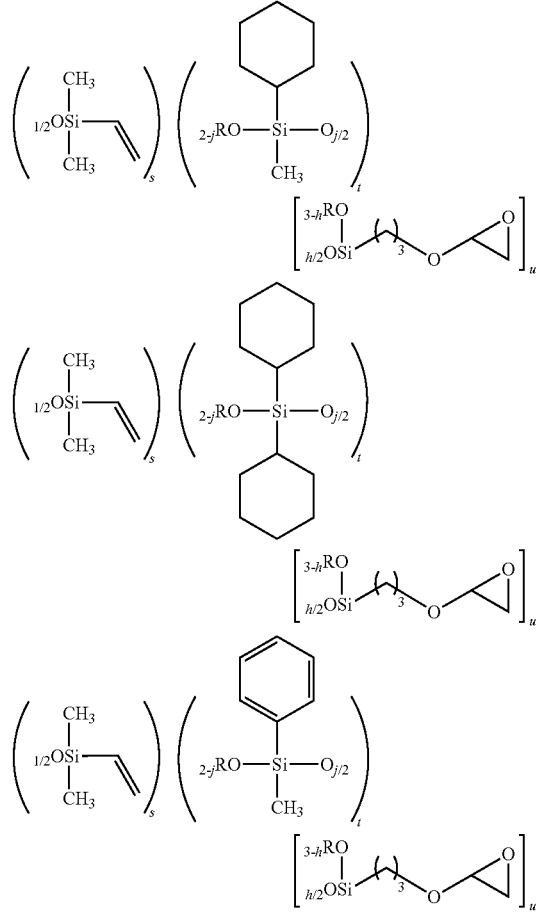

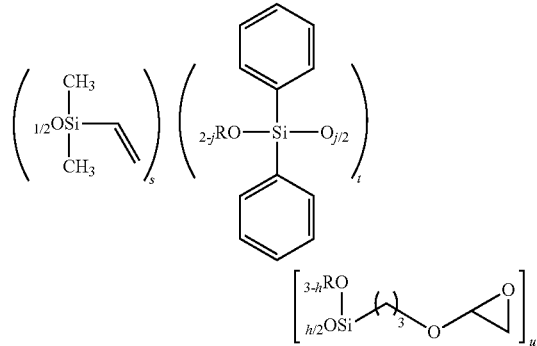

[formula 12]
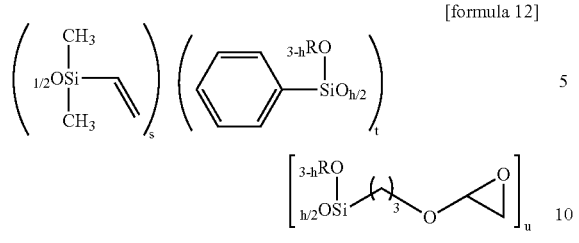
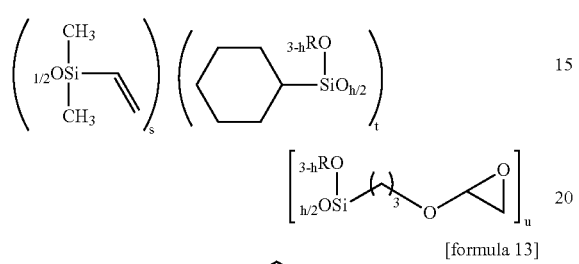
[formula 13]
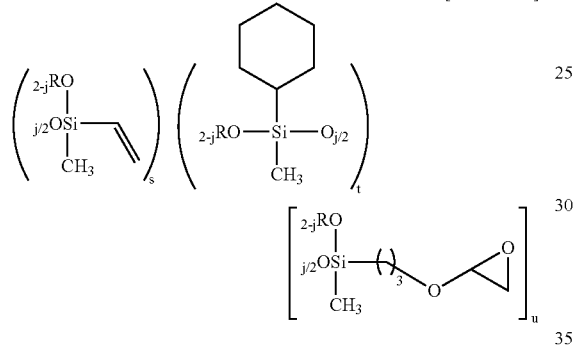
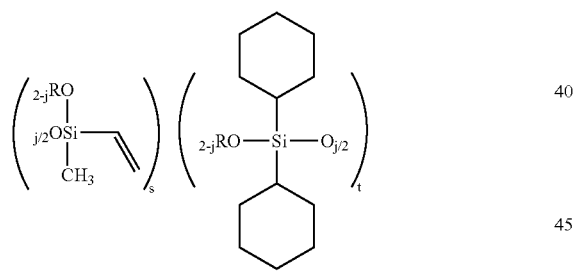
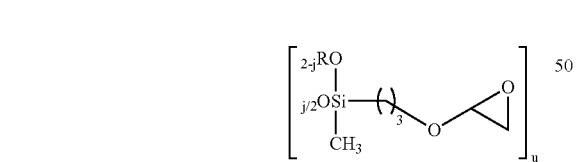
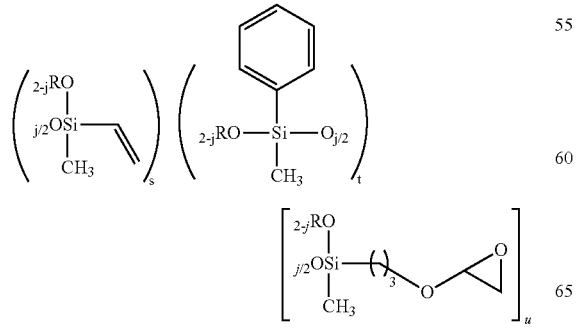
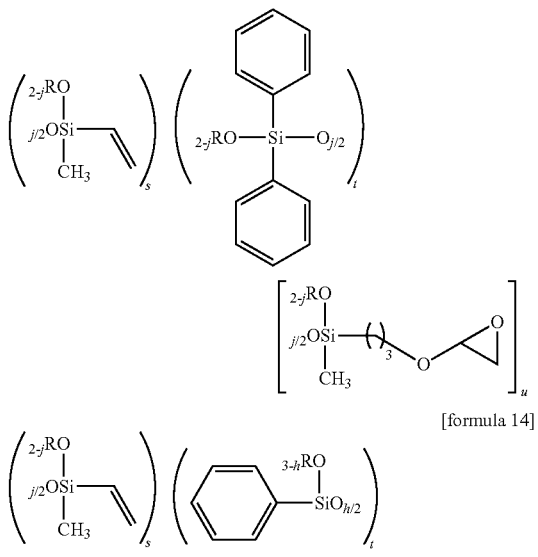
[formula 14]
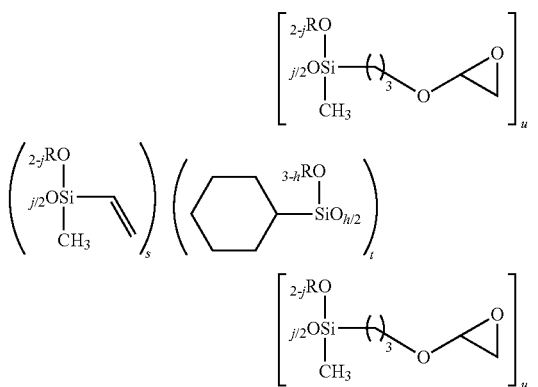
[formula 15]
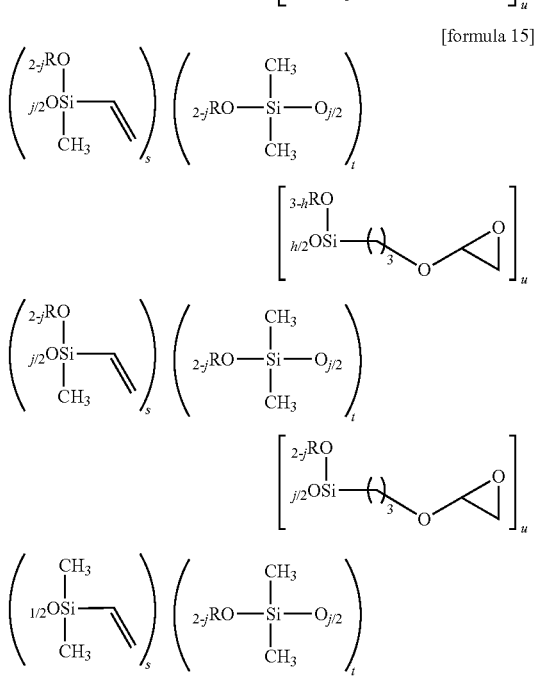

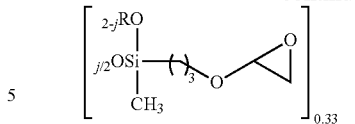

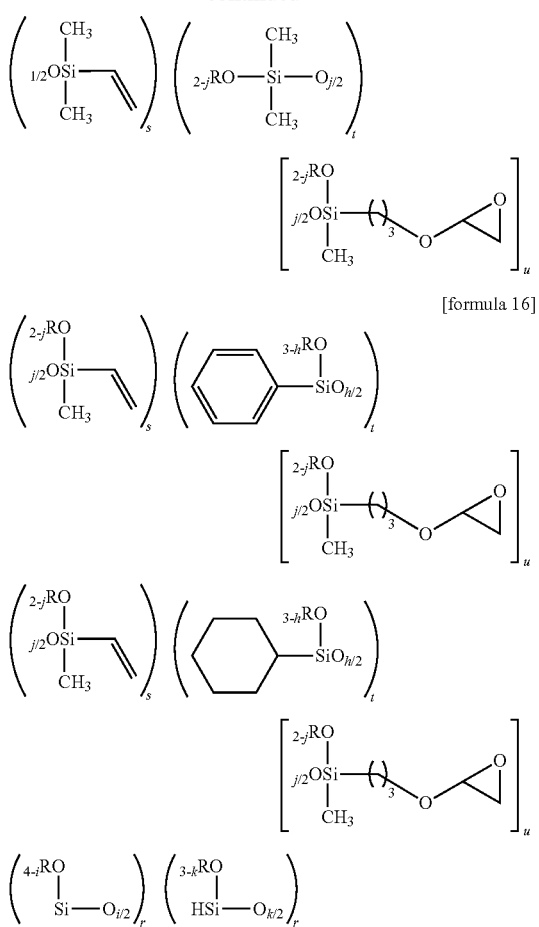

(wherein R is a substituted or non-substituted monovalent hydrocarbon group, preferably having 1-6 carbon atoms. Examples for R include alkyl groups such as methyl group, ethyl group, propyl group, isopropyl group, butyl group, isobutyl group, tert-butyl group, pentyl group, neopentyl group, hexyl group, octyl group, nonyl group and decyl group; i, j, h and k are natural numbers such that i is 1, 2, 3 or 4, j is 1 or 2, h is 1, 2 or 3, and k is 1, 2 or 3. Indices s, t and u represent positive integers satisfying: $0<s\leq1$, $0<t\leq1$, $0<u\leq1$, and $s+t+u=1$. Index r is a natural number satisfying $1\leq r\leq100$. The molecular weight of these organopolysiloxanes, in terms of an average molecular weight as calculated by conversion based on the polystyrene count as per GPC are in the range of 1,000-20,000, preferably 1,000-10,000, or more preferably 1,000-6,000.)

Of these, organic silicon compositions containing cyclohexyl group, alkoxyl group, epoxy group, or alkenyl group are preferable. In particular, the examples of such adhesion promoters are as shown below.

[formula 17]

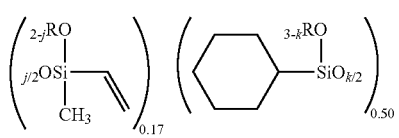

(j and k are as defined above, and R is a monovalent hydrocarbon group having 1-5 carbon atoms.)

Next, an antioxidant as an optional component (E) shall be explained. This component (E) is used to improve the heat stability of the silicone resin composition of the present invention by preventing its oxidation. A preferable example of such antioxidant is hindered phenolic antioxidant. The dosage of the component (E) is 0.001-3 mass parts, or preferably 0.05-1 mass part, relative to 100 mass parts consisting of the component (A) and the component (B). If the dosage of the component (E) exceeds the upper limit, the surplus antioxidant would separate in the surface of the resin after the curing, which is not good, and if the dosage is smaller than the lower limit, the resin's discoloration resistance is weakened, which is not good either.

Examples of the antioxidant as the component (E) include: pentaerythritoltetrakis[3-(3,5-di-t-butyl-4-hydroxyphenyl) propionate]; N,N'-propane-1,3-diylbis[3-(3,5-di-tert-butyl-4-hydroroxyphenyl)propionamide]; thiodiethylenebis[3-(3,5-di-tert-butyl-4-hydroroxyphenyl)propionate]; octadecyl-3-(3,5-di-t-butyl-4-hydroxyphenyl)propionate; 6,6'-di-tert-butyl-2,2'-thiodi-p-cresol; N,N'-hexane-1,6-diylbis[3-(3,5-di-tert-butyl-4-hydroxyphenylpropionamid)]; benzene propanoic acid; 3,5-bis(1,1-dimethyethyl)-4-hydroxy, C7-C9-branched alkyl ester; diethyl[[3,5-bis(1,1-dimethylethyl)-4-hydroxyphenyl]methyl]phosphonate; 2,2'-ethylidenebis[4,6-di-tert-butylphenol]; 3,3',3'',5,5',5''-hexa-tert-butyl-a,a',a''-(mesitylene-2,4,6-triyl)tri-p-cresol; diethylbis [[[3,5-bis(1,1-dimethylethyl)-4-hydroxyphenyl]methyl] phosphonate]calcium; 4,6-bis(octylthiomethyl)-o-cresol; 4,6-bis(dodecylthiomethyl)-o-cresol; ethylenebis(oxyethylene)bis[3-(5-tert-butyl-4-hydroxy-m-tolyl)propionate]; hexamethylenebis[3-(3,5-di-tert-butyl-4-hydroxyphenyl)propionate; 1,3,5-tris(3,5-di-tert-butyl-4-hydroxybenzyl)-1,3,5-triazine-2,4,6-trione; 1,3,5-tris[[(4-tert-butyl-3-hydroxy-2,6-xylyl)methyl]-1,3,5-triazine-2,4,6(1H,3H,5H)-trione; 6,6'-di-tert-butyl-4,4'-thiodi-m-cresol; diphenylamine; a product from reaction between N-phenylbenzeneamine and 2,4,4-trimethylpentene; 2,6-di-tert-butyl-4-(4,6-bis(octylthio)-1,3,5-triazine-2-ylamino)phenol; 3,4-dihydro-2,5,7,8-tetramethyl-2-(4,8,12-trimethyltridecyl)-2H-1-benzopyran-6-ol; 2',3-bis [[3-[3,5-di-tert-butyl-4-hydroxyphenyl]propionyl]] propionohydrazide; didodecyl-3,3'-thiodipropionate; and dioctadecyl3,3'-thiodipropionate. Also, preferable choices include: IRGANOX 245, 259, 295, 565, 1010, 1035, 1076, 1098, 1135, 1130, 1425 WL, 1520L, 1726, 3114, and 5057 (products names of BASF Japan LTD.). It is possible to use a mixture of two or more of these antioxidants.

The silicone composition of the present invention may be added with a known additive of various kind in addition to the components (A)-(E). Examples of such additive include: a reinforcing inorganic filler such as fumed silica and fumed titanium dioxide; a non-reinforcing inorganic filler such as calcium carbonate, calcium silicate, titanium dioxide, ferric oxide, carbon black and zinc oxide; a light stabilizer such as hindered amine; and a reactive thinner such as vinyl ethers, vinyl amides, an epoxy resin, oxetanes, allyl phthalates and adipic acid vinyl ester. These various additives may be added in amounts less than adversely affecting the purpose of the present invention.

Now, we will explain the method for preparing the silicone reins composition of the present invention. The silicone resin composition of the present invention is produced by adding together the above-prescribed components at once, or one after another, while the mixture is, optionally and depending on the necessity, heated, receiving stirring, being dissolved, being kneaded, and being dispersed; in practice, however, in order to prevent curing reaction to start before use, the components (A) and (C) on one hand and the component (B) on the other are stored separately in the two-part liquid system manner, and these two parts are mixed together upon use to allow curing to take place. If the component (B) and the component (C) are stored in one-liquid system manner, a dehydrogenation reaction is liable to occur, so that it is good if the component (B) and the component (C) are separately stored. Alternatively, it is possible to add a small amount of a curing resistive agent such as acetylene alcohol, in which case the all components may be stored in one-part liquid system.

There is no limitation as to the kind of apparatus used for the stirring, but it is good to use a Raikai mixer equipped with a stirrer and a heating device, or a three roller mill, or a ball mill or a planetary mixer, etc. It is also possible to use a hybrid of any two or more of these apparatuses. Incidentally, the viscosity at 25 degrees centigrade of the resulting silicone resin composition is preferably 100-10,000,000 mPa·s, or more preferably 300-500,000 mPa·s or so, as measured with a rotational viscometer. Within such viscosity range, the resin is more conveniently operated on and treated with.

The resultant silicone resin composition as obtained in the above-said manner is readily curable upon heating, if need be, to make a highly transparent body, which has a property of high adhesiveness to a package material and a metallic substrate such as LCP, so that it makes a good material for encapsulating an optical semiconductor device such as LED, photo diode, CCD, CMOS and photo coupler, and especially suitable for encapsulating LED.

As for the method for encapsulating an optical semiconductor device with the cured body of the silicone resin composition of the present invention, one can select any known method which is suitable to the particular kind of the optical semiconductor device to be encapsulated. There is no particular limit to the conditions under which the silicone resin composition is cured, but in an ordinary case, the curing temperature is 40-250 degrees centigrade, or preferably 60-200 degrees centigrade, and the curing time is 5 minutes to 10 hours, or preferably 10 minutes to 6 hours or so.

In a case wherein the encapsulation involves a lead frame plated with silver, it is preferable that the surface of the lead frame is treated beforehand, since the silver-plated lead frame is liable to increase the wettability of the silicone resin composition. Good examples for such a surface treatment, from the viewpoint of handling efficiency and sustainability of the facility, include dry treatments such as one with ultraviolet light, ozone and plasma, and plasma treatment is the most preferable. As for the material to make the pre-mold package, a preferable choice is one wherein silicone component accounts for 15 mass % or more of the total organic components in the pre-mold package, for the reason of increasing its compatibility or mutual solubility toward the silicone resin composition. The silicone component herein referred to means a compound containing an Si unit and a polymer of such a compound; and if the silicone component is less than 15 mass % of the total organic component, the compatibility with the silicone resin composition is lowered so that a space (or bubble) is formed between the silicone resin composition body and the pre-mold package during the resin encapsulation, which results in an unpopular optical semiconductor device easy to crack.

The cured body of the silicone resin composition of the present invention is free of unreacted hydrosilyl group so that its gas permeability is low, and as the result, the optical semiconductor device encapsulated with such cured substance makes an optical semiconductor device having excellent durability of its reflective efficiency owing to the restricted discoloration of the cured substance.

EXAMPLES

We will explain the invention in a concrete manner by showing examples and comparative examples, but one should not regard that the present invention is restricted to those examples.

Synthesis Example 1

In a flask, 1050 grams of xylene, 3652 grams of water, and 2625 grams (31.5 mol) of 12M-HCl were poured, and into this was added by dripping a mixture consisting of 2146 grams (10.5 mol) of cyclohexyltrimethoxysilane, 543 grams (4.50 mol) of vinyldimethylchlorosilane, and 1504 grams of xylene. After the completion of the dripping, the content of the flask was stirred for three hours; thereafter the acid formed was separated and removed and the remnant was washed with water. After subjecting the mixture to azeotropic dehydration, 0.84 gram of KOH was added to this and the mixture was subjected to a reflux at 150 degrees centigrade all night long. Then the resultant substance was neutralized with 27 grams of trimethylchlorosilane and 24.5 grams of potassium acetate, filtered, and subsequently stripped of the solvent to obtain a siloxane resin (Resin 1) having a structure shown below. The vinyl equivalent was 0.203 mol/100 gram.

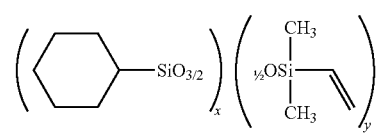

[formula 18]

wherein x:y=7:3.

Synthesis Example 2

In a flask, 1000 grams of xylene, 3020 grams of water, and 2250 grams (29.3 mol) of 12M-HCl were poured, and into this was added by dripping a mixture consisting of 1839 grams (9.0 mol) of cyclohexyltrimethoxysilane, 362 grams (3.00 mol) of vinyldimethylchlorosilane, and 1250 grams of xylene. After the completion of the dripping, the content of the flask was stirred for three hours, and thereafter the acid formed was separated and removed and the remnant was washed with water. After subjecting the mixture to azeotropic dehydration, 0.63 gram of KOH was added to this and the mixture was subjected to a reflux at 150 degrees centigrade all night long. Then the resultant substance was neutralized with 27 grams of trimethylchlorosilane and 24.5 grams of potassium acetate, filtered, and subsequently stripped of the solvent to obtain a siloxane resin (Resin 2) having a structure shown below. The vinyl equivalent was 0.066 mol/100 gram.

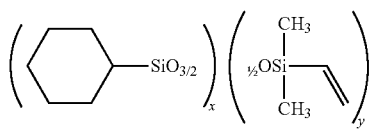

wherein x:y=7.5:2.5.

Synthesis Example 3

In a flask, 1000 grams of xylene, 2913 grams of water, and 2250 grams (29.3 mol) of 12M-HCl were poured, and into this was added by dripping a mixture consisting of 1839 grams (9.0 mol) of cyclohexyltrimethoxysilane, 271 grams (2.25 mol) of vinyldimethylchlorosilane, and 1005 grams of xylene. After the completion of the dripping, the content of the flask was stirred for three hours, and then the acid formed was separated and removed and the remnant was washed with water. After subjecting the mixture to azeotropic dehydration, 0.63 gram of KOH was added to this and the mixture was subjected to a reflux at 150 degrees centigrade all night long. Then the resultant substance was neutralized with 27 grams of trimethylchlorosilane and 24.5 grams of potassium acetate, filtered, and subsequently stripped of the solvent to obtain a siloxane resin (Resin 3) having a structure shown below. The vinyl equivalent was 0.136 mol/100 gram.

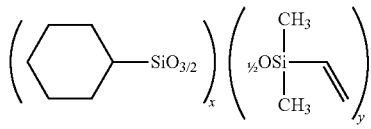

wherein x:y=8:2.

Synthesis Example 4

In a flask, 457.25 grams (2.43 mol) of cyclohexylmethyldimethoxysilane and 163.05 grams (1.21 mol) of $(HSiMe_2)_2O$ were poured and were cooled to 10 degrees centigrade or lower, and to this were added by dripping 24.81 grams of concentrated sulfuric acid and 96.14 grams of water, and the mixture was stirred all night long. Next, the acid formed was separated and removed, and the remnant was washed with water, and then was subjected to vacuum distillation to yield a hydrogenorganopolysiloxane 1 having a structure shown below. The amount of the hydrogen gas generated was 113.59 ml/gram (0.507 mol/100 gram).

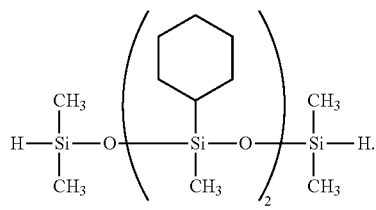

Synthesis Example 5

In a flask, 204.34 grams (1.00 mol) of cyclohexyltrimethoxysilane and 201.48 grams (1.50 mol) of $(HSiMe_2)_2O$ were poured and were cooled to 10 degrees centigrade or lower, and to this were added by dripping 16.23 grams of concentrated sulfuric acid and 50.26 grams of water, and the mixture was stirred all night long. Next, the acid formed was separated and removed, and the remnant was washed with water, and then was subjected to vacuum distillation to yield a hydrogenorganopolysiloxane 2 having a structure shown below. The amount of the hydrogen gas generated was 181.51 ml/gram (0.810 mol/100 gram).

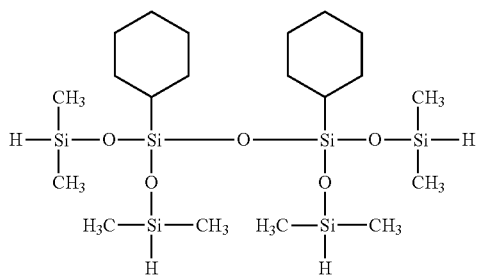

Synthesis Example 6

In a flask, 204.34 grams (1.00 mol) of cyclohexyltrimethoxysilane and 302.22 grams (2.25 mol) of $(HSiMe_2)_2O$ were poured and were cooled to 10 degrees centigrade or lower, and to this were added by dripping 20.26 grams of concentrated sulfuric acid and 62.74 grams of water, and the mixture was stirred all night long. Next, the acid formed was separated and removed, and the remnant was washed with water, and then was subjected to vacuum distillation whereby a hydrogenorganopolysiloxane 3 having a structure shown below was synthesized. The amount of the hydrogen gas generated was 189.03 ml/gram (0.8439 mol/100 gram).

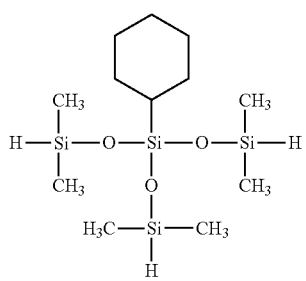

Synthesis Example 7

In a flask, 5376 grams (22.0 mol) of diphenyldimethoxysilane and 151.8 grams of acetonitrile were poured and were cooled to 10 degrees centigrade or lower; then a reaction was conducted by adding the following reactants drop-wise, keeping the temperature of the system at 10 degrees centigrade or lower: therefore, dripped were 303.69 grams of concentrated sulfuric acid, 940.36 grams of water, which was completed in one hour, and 2216 grams (16.5 mol) of $(HSiMe_2)_2O$, and the system was stirred all night long. Next, the acid formed was separated and removed, and the remnant was washed with water, and then was subjected to vacuum distillation whereby a straight-chained hydrogenorganopolysiloxane 4 having a structure shown below was synthesized. The amount of the hydrogen gas generated was 90.32 ml/gram (SiH group equivalent of 0.403 mol/100 gram). According to a gas chromatography (GC) measurement, the ratio of the amount of hydroxyl group plus alkoxy group as opposed to the total mass of all of the X-group was 5.0 mass %.

[formula 24]

$$H-\underset{CH_3}{\overset{CH_3}{\underset{|}{Si}}}-O-\left(\underset{Ph}{\overset{Ph}{\underset{|}{Si}}}-O\right)_n-X$$

[wherein n=2.0 (in average), and 95% of X is Me$_2$SiH and 5% of X is Me].

Synthesis Example 8

(E) Adhesion Promoter 1

A 158.01 grams (1.195 mol) of vinylmethyldimethoxysilane, 712.70 grams (3.585 mol) of cyclohexyltrimethoxysilane, 525.51 grams (2.385 mol) of 3-glycidoxypropylmethyldimethoxysilane and 1500 mol of IPA (isopropyl alcohol) were mixed together, and to this were admixed 49.20 grams of 25 wt % aqueous solution of tetramethylammoniumhydroxide and 444 grams of water, and the system was stirred for three hours. Then, toluene was added and the system was neutralized with sodium dihydrogen phosphate, washed with water, and was subjected to vacuum distillation, whereupon a compound having a structure shown below (wherein k=1, 2 or 3; j=1 or 2; R is independently H or methyl or isopropyl) was synthesized. This compound is labeled as adhesion promoter 1

[formula 25]

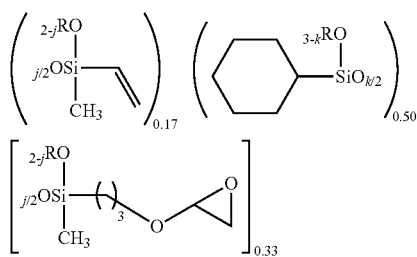

Synthesis Example 9

(E) Adhesion Promoter 2

A 264.46 grams (2.00 mol) of vinylmethyldimethoxysilane, 7733.08 grams (3.00 mol) of diphenydimethoxysilane, 1181.5 grams (5.00 mol) of 3-glycidoxypropyltrimethoxysilane and 2700 mol of IPA were put together, and to this were admixed 82.00 grams of 25 wt % aqueous solution of tetramethylammoniumhydroxide and 740 grams of water, and the system was stirred for three hours. Then, toluene was added and the system was stirred for three hours. Then, toluene was added and the system was neutralized with sodium dihydrogen phosphate, washed with water, and was subjected to vacuum distillation, whereupon a compound having a structure shown below (wherein k=1, 2 or 3; j=1 or 2; R is independently H or methyl or isopropyl) was synthesized. This compound is labeled as adhesion promoter 2.

[formula 26]

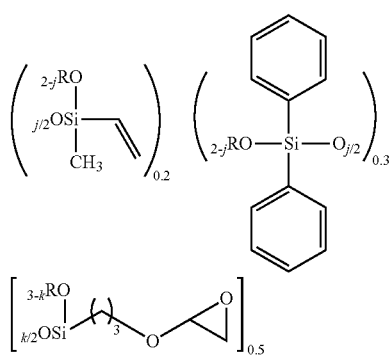

Synthesis Example 10

Into a flask were poured 1000 grams of xylene and 5014 grams of water, and to this were added drop-wise a mixture consisting of 2285 grams (10.8 mol) of phenyltrichlorosilane, 326 grams (2.70 mol) of vinyldimethylchlorosilane and 1478 grams of xylene. After the completion of the dripping the system was stirred for three hours, and next the acid formed was separated and removed, and the remnant was washed. After subjecting the mixture to azeotropic dehydration, 0.84 gram of KOH was added to this and the mixture was subjected to a reflux at 150 degrees centigrade all night long. Then the resultant substance was neutralized with 27 grams of trimethylchlorosilane and 24.5 grams of potassium acetate, filtered, and subsequently stripped of the solvent, whereupon a siloxane resin (Resin 4) having a structure shown below was obtained. The average molecular weight of the synthesized siloxane resin as calculated by conversion based on the polystyrene count as per GPC was 1820, and its vinyl equivalent was 0.13 mol/100 gram.

[formula 27]

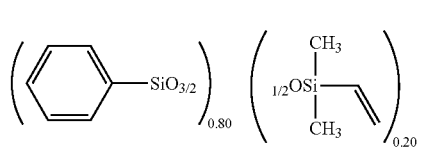

Examples 1-4

Each one of the products as prepared in the Synthesis Examples 1-10 was mixed with the elements described below at compositions shown in Table 1, to produce a silicone resin composition.

Hydrogenorganopolysiloxane 5:
Phenyl group-containing branched organohydrogenpolysiloxane
Hydrogen gas generation amount: 170.24 ml/g (0.760 mol/100 gram)
Platinum-containing catalyst: dimethylpolysiloxane (both terminals being capped with dimethylvinylsilyl group) solution of Pt-divinyltetramethyldisiloxane complex [Pt atom content being 1 mass %]

Antioxidant: IRGANOX 1076 (product name of BASF Japan LTD.).

Comparative Examples 1, 2, 3

In the Comparative Examples 1, 2 and 3, the following compounds were used for vinylorganopolysiloxane component.

Vinylphenylpolysiloxane (vinyl equivalent being 0.0185 mol/100 gram)

[formula 28]

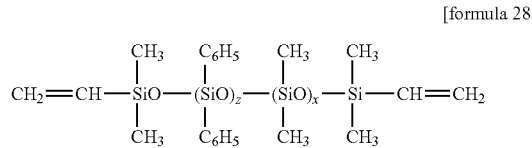

(molecular weight is 11000, z=30, x=68).

Also, in accordance with JIS K 6301, hardness (tested by Type A spring test machine), tensile strength and elongation coefficient were measured. Further, in accordance with JIS K 7129, the water vapor permeation rate was measured by way of Lyssy method (by Analyzer L80-5000, a product name of a company called Lyssy). The result is shown in Table 1.

Incidentally, in Table 1, the ratio of Si—H/Si-Vi means the respective amounts of SiH groups in the hydrogenorganopolysiloxanes 1-5 divided by molar weight of vinyl groups of the corresponding Resins 1-5 or vinylphenylpolysiloxanes of Examples 1-4, Comparative Examples 1, 2, 3. Also, cyclohexyl group ratio (mol %) means the molar percentage of the cyclohexyl group obtained by dividing the weight of cyclohexyl groups by the total weight of the cycloalkyl groups and the monovalent hydrocarbon groups in the trifunctional unit and monofunctional unit of Resins 1-5 of Examples 1-4, and Comparative Examples 1, 2, 3.

TABLE 1

|  |  | Example 1 | Example 2 | Example 3 | Example 4 | Comparative Example 1 | Comparative Example 2 | Comparative Example 3 |
|---|---|---|---|---|---|---|---|---|
| Si—H/Si-Vi ratio |  |  |  |  | 1.1 |  |  |  |
| Resin 1 | part | 63.7 |  |  |  | 59.7 |  |  |
| Resin 2 | part |  | 75.3 |  |  |  |  |  |
| Resin 3 | part |  |  | 77.8 | 78.2 |  |  |  |
| Resin 4 | part |  |  |  |  |  | 65.4 |  |
| Resin 5 | part |  |  |  |  |  |  | 45.0 |
| Vinylphenylpolysiloxane | part |  |  |  |  | 14.9 | 16.3 | 48.4 |
| Hydrogen-organopolysiloxane 1 | part |  | 19.7 |  |  |  |  |  |
| Hydrogen-organopolysiloxane 2 | part |  |  | 6.7 |  |  |  |  |
| Hydrogen-organopolysiloxane 3 | part |  |  |  | 6.5 |  |  |  |
| Hydrogen-organopolysiloxane 4 | part | 35.3 |  | 15.5 | 15.3 | 17.8 | 12.8 | 2.2 |
| Hydrogen-organopolysiloxane 5 | part |  | 4.9 |  |  | 7.6 | 5.5 | 3.4 |
| Platinum-containing catalyst | part | 0.02 | 0.02 | 0.02 | 0.02 | 0.02 | 0.02 | 0.02 |
| Adhesion promoter 1 | part | 4 | 4 | 4 | 4 |  |  |  |
| Adhesion promoter 2 | part |  |  |  |  | 4 | 4 | 4 |
| Anti-oxidant | part | 0.1 | 0.1 | 0.1 | 0.1 | 0.1 |  | 0.1 |
| Cyclohexyl group | mol % | 44 | 50 | 57 | 57 | 44 | 0 | 14 |
| After curing | appearance | Colorless and transparent | Colorless and transparent | Colorless and transparent | Colorless and transparent | Colorless and transparent | Colorless and transparent | Colorless and transparent |
| hardness | Type A | 83 | 89 | 92 | 95 | 83 | 75 | 65 |
|  | Type D |  |  | 43 | 54 | 22 |  |  |
| Tensile strength | MPa | 1.4 | 2.1 | 1.7 | 1.5 | 1.9 | 1.1 | 0.8 |
| Elongation rate | % | 100 | 65 | 40 | 15 | 60 | 80 | 120 |
| Water vapor permeation rate | g/m²*day | 8 | 6 | 4 | 5 | 18 | 17 | 40 |

Resin 5 used in the Comparative Example 3 is an organopolysiloxane having the following structural unit.
Resin 5
$SiO_2$ unit: 40 mol %
$(C_6H_5)SiO_{3/2}$ unit: 20 mol %
$Me_3SiO_{1/2}$ unit: 32.5 mol %
$ViMe_2SiO_{1/2}$ unit: 7.5 mol %
Vinyl equivalent: 0.0498 mol/100 gram
The silicone resin compositions of Examples 1-4 and Comparative Examples 1, 2, 3 were thermally molded to form a cured body (width×length×thickness being 110 mm×120 mm×2 mm) and the appearance was observed with eyes.

Optical semiconductor devices were fabricated with the encapsulation made with the cured substances of the silicone resin compositions of Examples 1-4 and Comparative Examples 1 and 2.

Fabrication of LED Device

An Ar plasma was applied under a reduced pressure (output 100 W; irradiation time 10 seconds) to a cup-shaped pre-mold package (3 mm×3 mm×1 mm; the diameter at the opening end 2.6 mm) for LED, which has a copper-made lead frame plated with a 2-micrometer thick silver layer arranged over the bottom face, and then to the lead frame at the bottom face an electrode of an InGaN-system blue light emitting device was connected by means of a silver paste (electrical conductive adhesive) and the counter electrode of the light emitting device was connected to the counter lead frame by means of a gold wire, and then the package opening was filled with various addition curable type silicone resin compositions, which were cured at 60 degrees centigrade for one hour and then at 150 degrees centigrade for four hours to complete the encapsulation.

A 25 mA electric current was passed through the thus fabricated LED devices to keep it lighting in an atmosphere of 150 degrees centigrade-hot hydrogen sulfide for 1000 hours; thereafter the discoloration situation in the vicinity of the silver-plated surfaces inside the package was inspected with eyes (vulcanization test). Also, the fabricated LED devices were subjected to a heat cycle test (200 cycles, each cycle consisting of keeping the device at −40 degrees centigrade for 15 minutes and then at 100 degrees centigrade for 15 minutes), and the LED was lighted for 500 hours under a condition of 60 degrees centigrade/90-RH % (constant-temperature, constant-humidity lighting test), and an eye inspection was conducted with respect to the adhesion situation of the package interface, existence of crack (defective rate) and development of discoloration. The results are shown in Table 2.

(wherein $R^1$ is a cycloalkyl group, $R^2$ is either one kind of or more than one kind of substituted or non-substituted monovalent hydrocarbon group having 1-10 carbon atoms, x is 0.5-0.9, y is 0.1-0.5, z is 0-0.2, and x+y+z=1.0), (B) a hydrogen organopolysiloxane containing at least two SiH groups per one molecule,
(C) a catalyst for addition reaction,
(D) an adhesion promoter agent.

2. The silicone resin composition as claimed in claim 1, wherein the component (B) is a hydrogenorganopolysiloxane represented by the following general formula (2):

$$R^3_a H_b SiO_{(4-a-b)/2} \quad (2)$$

(wherein $R^3$ is a monovalent, substituted or non-substituted, non-alkenyl hydrocarbon group having 1-10 carbon atoms, and a is 0.4 through 1.5, b is 0.05 through 1.0, and a+b is 0.5 through 2.0).

3. The silicone resin composition as claimed in claim 1, further containing (E) an antioxidant.

4. The silicone resin composition as claimed in claim 1, wherein said component (C) is a platinum group metal-containing catalyst and its content, as calculated by the net weight

TABLE 2

|  | Example 1 | Example 2 | Example 3 | Example 4 | Comparative Example 1 | Comparative Example 2 | Comparative Example 3 |
|---|---|---|---|---|---|---|---|
| Vulcanization test (150° C./1000 hr) appearance | colorless and transparent | colorless and transparent | colorless and transparent | colorless and transparent | somewhat yellowed | somewhat yellowed | browned |
| Temperature Cycle test (−40 ⇔ 100° C./200 cycles) defective rate and appearance | 0/5 colorless and transparent | 0/5 colorless and transparent | 0/5 colorless and transparent | 0/5 colorless and transparent | 3/5(cracked) colorless and transparent | 1/5(exfoliation) colorless and transparent | 5/5(cracked) colorless and transparent |
| Constant-temperature, constant-humidity lighting test (60° C./90RH %/500 hr) defective rate and appearance | 0/5 colorless and transparent | 0/5 colorless and transparent | 0/5 colorless and transparent | 0/5 colorless and transparent | 4/5(exfoliation) somewhat yellowed | 0/5(exfoliation) somewhat yellowed | 5/5(cracked) yellowed |

As is seen from Tables 1 and 2, the cured substances of the silicone compositions according to the present invention were low in water vapor permeability, and the optical semiconductor devices encapsulated with such cured substances did not show discoloration in the silver-plated surface, nor did the surface come off or crack.

INDUSTRIAL APPLICABILITY

The silicone composition according to the present invention yields a cured substance which is low in gas permeability, and can contribute to a making of an optical semiconductor device excellent in discoloration resistance, and therefore makes a good molding compound for encapsulating an optical semiconductor device.

What is claimed is:
1. A silicone resin composition characterized in comprising the following components (A)-(D):
(A) an organopolysiloxane as shown in the following general formula (1) in which the number of alkenyl groups contained per one molecule is two or more

$$(R^1 SiO_{3/2})_x (R^2_3 SiO_{1/2})_y (R^2_2 SiO_{2/2})_z \quad (1)$$

of the platinum group metal, is 0.0001-0.2 mass part relative to 100 mass parts consisting of the component (A) plus the component (B), and the content of said component (D) is 0.001-10 mass parts relative to 100 parts consisting of the component (A) plus the component (B).

5. The silicone resin composition as claimed in claim 1, wherein the component (B) is contained in an amount such that for every one mol of alkenyl group of the component (A) there exists 0.5 to 4.0 mol of SiH group of the component (B).

6. The silicone resin composition as claimed in claim 1, wherein the content of the cycloalkyl group ($R^1$) is such that it accounts for 25-80 mol % of the total of $R^1$ and $R^2$ of the component (A).

7. An optical semiconductor device which is encapsulated with a cured body of a silicone resin composition as claimed in claim 1.

* * * * *